(12) United States Patent
Jackson

(10) Patent No.: US 7,350,161 B1
(45) Date of Patent: Mar. 25, 2008

(54) SYSTEM DESIGN TOOLS

(75) Inventor: Robert Jackson, Headington (GB)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/618,060

(22) Filed: Jul. 11, 2003

(51) Int. Cl.
*G06F 17/50* (2006.01)
*G06F 13/14* (2006.01)
*G06F 13/36* (2006.01)

(52) U.S. Cl. .................. 716/1; 716/3; 716/16; 710/305; 710/315

(58) Field of Classification Search ................. 716/3–5, 716/16–18, 1; 710/305, 315, 11, 105; 709/220
See application file for complete search history.

(56) References Cited

U.S. PATENT DOCUMENTS

| | | | | |
|---|---|---|---|---|
| 5,422,833 A | * | 6/1995 | Kelem et al. ................. | 716/16 |
| 6,009,466 A | * | 12/1999 | Axberg et al. ............... | 709/220 |
| 6,691,301 B2 | * | 2/2004 | Bowen ........................ | 716/16 |
| 6,694,488 B1 | * | 2/2004 | Raghunathan et al. ......... | 716/1 |
| 6,721,830 B2 | * | 4/2004 | Vorbach et al. ................ | 716/16 |
| 6,826,639 B2 | * | 11/2004 | Pasumansky et al. ........ | 710/105 |
| 6,895,447 B2 | * | 5/2005 | Brewer et al. ................. | 710/11 |
| 2003/0101307 A1 | * | 5/2003 | Gemelli et al. ............. | 710/305 |
| 2003/0217176 A1 | * | 11/2003 | Beunings ..................... | 709/238 |
| 2004/0068554 A1 | * | 4/2004 | Bales et al. .................. | 709/218 |

* cited by examiner

*Primary Examiner*—Paul Dinh
(74) *Attorney, Agent, or Firm*—Townsend and Townsend and Crew LLP

(57) ABSTRACT

A system design method for designing bus-based systems is described. The method includes automatically defining an allowed set of parameter values for the system components concerned.

13 Claims, 6 Drawing Sheets

```
PROTOCOL NAME

PARAMETER 1 VALUE

PARAMETER 2 VALUE
       .
       .
       .
PARAMETER N VALUE
```

FIGURE 4

SYSTEM DESIGN TOOLS

The present invention relates to system design tools, and, in particular, to tools for designing bus-based systems.

BACKGROUND OF THE INVENTION

Integrated circuits are often designed using pre-designed Intellectual Property (IP) modules. Such modules define all of part of a function or function within an integrated circuit. The modules are often supplied as a parameterisable core or as an executable module generator (for example, a Perl, TCL, or Java executable that generates a configured HDL (Hardware Description language) instance of the IP module). Ports on a module either provide a complete set of connections as specified by the bus/communication protocol, or are configured by the designer to implement only the subset of features needed for the application.

In one example of a system design tool, the Altera NIOS™ System Builder uses a proprietor file format (labelled ".ptf") file to describe connections on an IP module. Each port of the module can be specified as bus slave or as bus master. Other parameters such as module base address, port width, and port name on the component can be specified. When incorporated into a design, the module description is used to construct a "bus module" which has appropriate connections to the module itself.

Configuring each module in a system by hand is a time consuming and error prone activity. As each module is unaware of the requirements and capabilities of the other modules to which it is connected it is impossible to remove unused services or make other optimisations in an efficient way. Indeed, with anything other than the most trivial of systems, the task is practically impossible.

In addition, new bus protocols cannot be specified without modifying the design tool significantly.

Accordingly, it is desirable to provide a design tool and method which can overcome these problems.

SUMMARY OF THE PRESENT INVENTION

According to one aspect of the present invention, there is provided a system design method for designing systems having a plurality of components interconnected via a bus, the method comprising defining respective functional representations of system components in the system, defining a functional representation of the bus in the system, each such functional representation including a number of variable parameters, and defining an allowed set of parameters for each system component, in dependence upon the functional representations of the set of system components connected to the bus.

BRIEF DESCRIPTION OF THE DRAWINGS

FIG. 4 illustrates a functional model of a component;

DETAILED DESCRIPTION OF THE PREFERRED EMBODIMENTS

Figure 1:
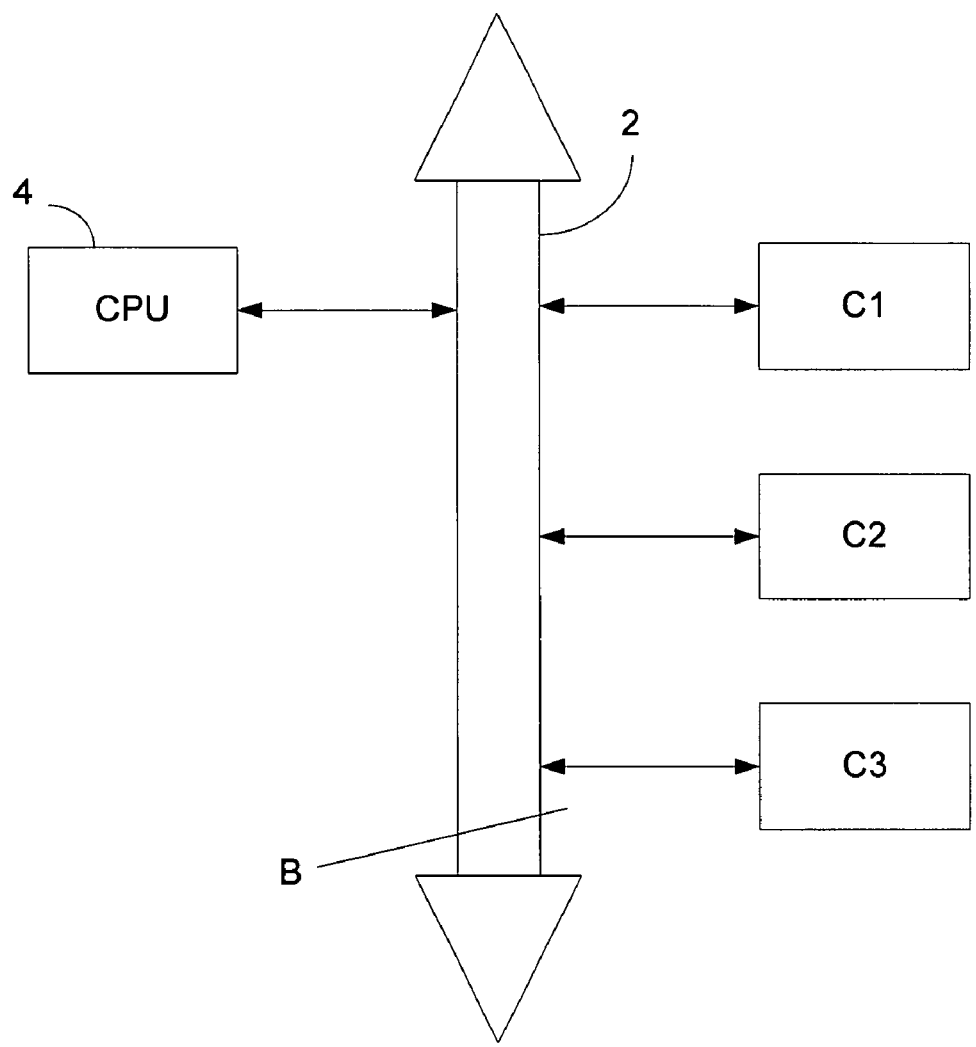
FIG. 1 illustrates a bus-based system including a plurality of system components.

FIG. 1 illustrates a bus-based system as an example of a system to be designed by a designer using a method and apparatus embodying the present invention. The system includes a bus 2 having a number of data lines B, which interconnects a plurality of system components. The number of data lines can be referred to as the "width" of the bus. The bus could be replaced by a simple point-to-point connection. In the example shown in FIG. 1, a CPU 4 and a plurality of peripheral devices C1, C2 and C3 are connected to the bus 2. The components communicate with one another via the bus 2. In a system design tool embodying the present invention, each of the system components CPU 4, C1, C2 and C3, and the bus 2, are presented to the user as functional representations. The functional representation of each component includes a number of parameters which define the operating characteristics of the components. For example, the functional representation of the bus 2 could specify the width of the bus 2, and the protocol used for communicating thereon. Similarly, each of the system components has a number of parameters associated therewith, which parameters define the functional operation of the component concerned.

Types of parameter could usefully include type of bus protocol (for example, AHB, OPB, APB, USB), and type of bus transactions supported (for example, burst, locked, word, half word, byte). General parameters, such as the ordering of bytes of data (endianness), can also be specified.

As described above, using existing development tools, the system designer must define the parameters in each of the components of the system manually, in dependence upon the combination of the components.

In a system design method embodying the present invention, at least one allowed set of parameter values is automatically computed for the components in the system, in dependence upon the overall system configuration. The allowed set of values is such that the system components, when set up according to the values, are compatible with one another. For example, the bus could be configured with 8, 16, 32 or 64 data lines, and could operate using a certain bus protocol. The CPU 4 could support output data widths of 16 or 32 bits, and the components C1, C2 and C3 could each support data widths of 8 or 16 bits. Accordingly, in accordance with the present invention, an allowed parameter value for the bus width, and hence the data connections to each of the system components, would be 16 bits, since this is the only value common to all of the components.

It will be appreciated that the choice of bus width is a particularly simple example, but the principles are applicable to any particular parameter or group of parameters.

Producing a set of allowed parameters in this way enables the system designer to choose more rapidly the parameter values concerned. For example, if the allowed bus width included multiple values, then the system designer would have to choose the particular value for the design. However, since the possible values presented to the system designer are reduced from the total number of possibilities, to only those values which are applicable to the system as a whole, the design process is much more rapid than previous methods.

Figure 2:
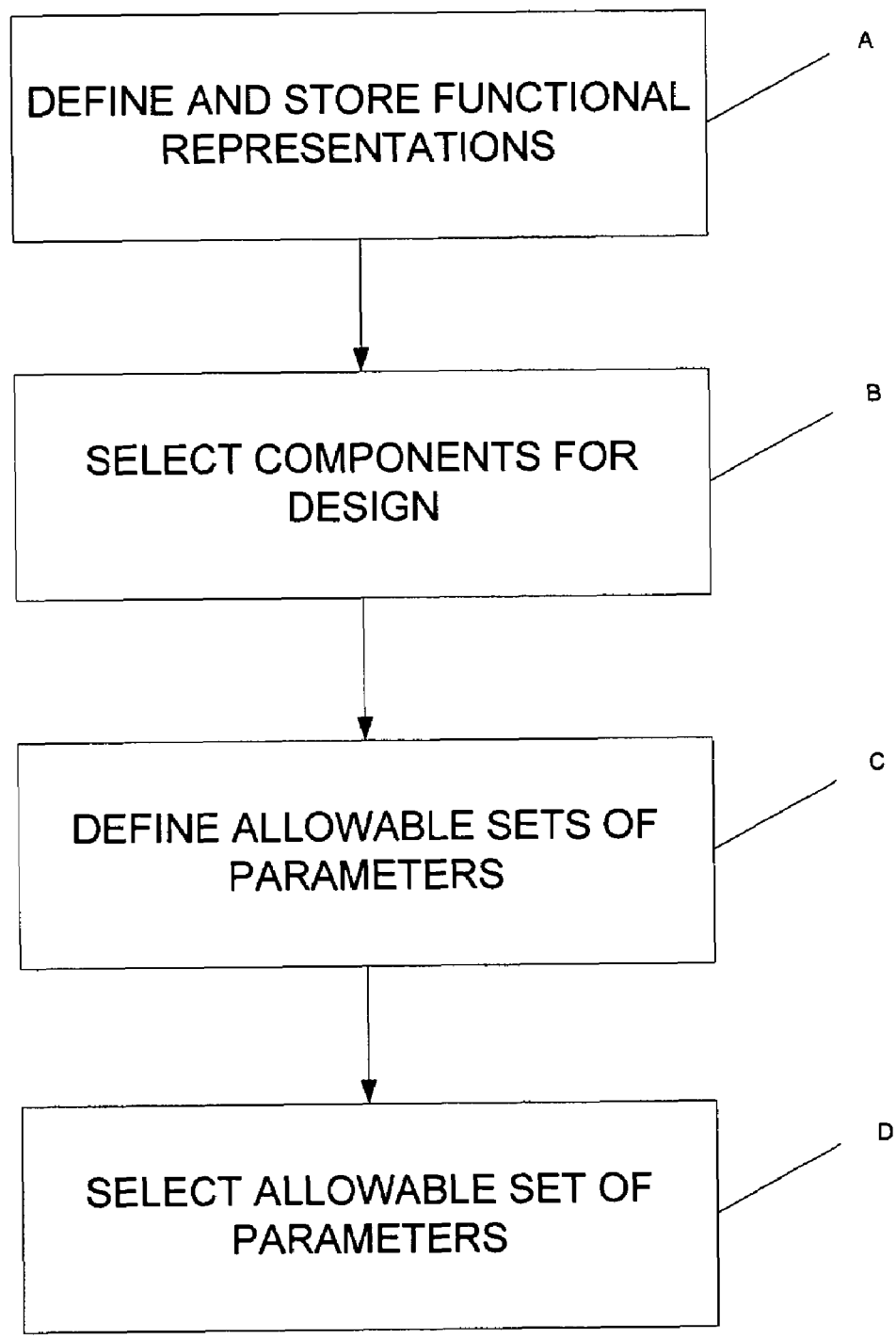
FIG. 2 illustrates a method embodying one aspect of the present invention.
Figure 3:
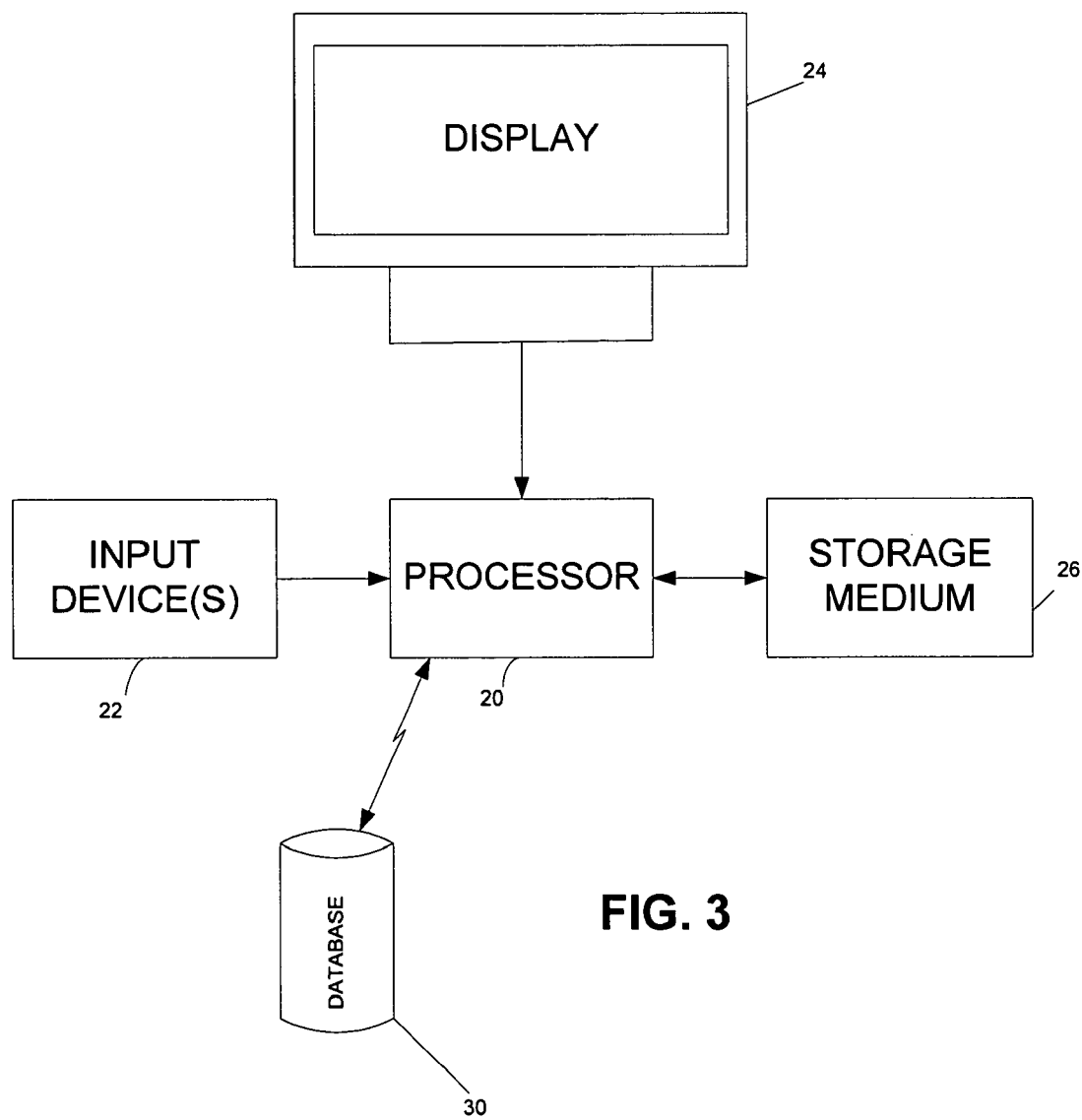
FIG. 3 illustrates an apparatus operable in accordance with a method embodying the present invention.

A method embodying the present invention is illustrated in FIG. 2, and FIG. 3 illustrates an apparatus for carrying out the method. The apparatus shown in FIG. 3 includes a processor 20 which is operable to carry out steps in the method in response to user inputs received via at least one input device 22. The processor 20 operates to access data stored in a storage medium 26, such as a hard disk drive (HDD), and/or memory. The processor 20 is connected to a display device 24 to display to the user the results of the operations performed. The processor 20, input device(s) 22, display 24 and storage medium 26 are usefully provided by a personal computer (PC) or workstation. Such a device can be operated on a stand-alone basis or in connection with a network.

The processor 20 also has access to a database 30 which holds library information concerning component representations that have been defined previously. The database could be stored locally on the PC or workstation, or could be provided on a central storage device via a network connection.

The method will be described with reference to FIGS. 2 and 3. The functional representations of the system components are defined and stored (A) in the database 30, and the components for inclusion in the design are selected (B). The components chosen do not necessarily have to include a bus or other data transfer component.

However, most designs use at least one data transfer component. The design system processor 20 automatically selects at least one allowable set of parameter values for the combination of selected system components.

FIG. 4 illustrates a component model for use in a method embodying the present invention. The model includes a component name, and a number of parameter values that define the functional representation of the component concerned.

There are three aspects to a preferred method embodying the present invention. Firstly, there is the definition of the bus/communication protocol. Secondly, there is the association of a port on an IP block with one or more such protocols, and thirdly there is the definition of sets of allowed parameter values for the group of system components concerned. The various stages of such a method will now be outlined.

Defining a Bus/Communication Protocol

Each definition begins with a prologue defining its name (ie. the "PROTOCOL NAME" in FIG. 4).

The protocol definition is made up of 4 sections:
1. parameters
2. operations
3. connections
4. roles 1. Parameters A number of parameters are associated with a protocol definition. For example:

respectively define the number of wait states and the data width of the bus. These parameters have a type and set of allowed values associated with them.

2. Operations

Each component port is defined by the "operations" that pass through it. For example, a port on a memory device would conceptually accept read and write operations. Definition checking can be performed to ensure that ports are connected in a manner that is consistent with each of the sets of allowed values of the parameters. For example, a port that generates 16-bit write operations can only be connected to a port that accepts them. Available operations are described as follows:
 <OPERATION name="master-to-bus"
parameter="data_width"/>
 <OPERATION name="bus-to-slave"
parameter=data_width, wait_states"/>
 <OPERATION name="master-bus-request"/>

Operations are used to describe logical restrictions on the connection of components. Parameters may be associated with operations to ensure that only ports supporting compatible modes of operation are connected.

3. Connections

The goal of a protocol definition is to connect two components together correctly. Connections are therefore defined in terms of, for example, width and the input/output functions that the connection performs. The width of the connection can be set to a default value of "1", or can be specified by a specific parameter value. For example, connections can be described as below:
 <WIRE name="_wdata" width="data_width">
 <OUTPUT-FOR operationName="master-to-bus"/>
 <OUTPUT-FOR operationName="bus-to-slave"/>
 </WIRE>
 <WIRE name="_bus_grant" width="1">
 <INPUT-FOR operationName="master-bus-request"/>
 </WIRE>

The direction (input/output) of a connection is defined with respect to an operation. If a component accepts write operations then data is an input, and conversely if a component generates write operations then data is an output. A wire may be specified as both an input-for and an output to.

4. Roles

A component typically implements a standard set of connections as part of a wiring definition and so a number of standard modes of operation, or "roles" are defined within the protocol. These roles specify what operations a port may generate or accept and hence the connected to which it is connected.
 <ROLE name="32 bus master">
 <GENERATE operationName="master-to-bus"/>
 <GENERATE operationName="master-bus-request"/>
 </ROLE>

The definition is completed by the XML closing brace:

</PROTOCOL>

Describing a Port on an IP Block

A port on an IP block can be defined in two ways. The simplest is to specify a role specified in the protocol definition. The following specifies that a port operates as a 32-bit AHB bus master:
 <PORT name="ahb bus port">
 <PROTOCOL spec="com/altera/AlteraAHB.xml">
 <ROLE roleName="32 bus master"/>
 </PROTOCOL>
 </PORT>

More complex ports can be described by directly specifying the operations that the port may generate and those that may be accepted. The description below is of a port that "accept" a variety of read operations and can generate a "split master response" operation—the specification details that the port cannot "accept" write transactions:
 <PORT name="complex ahb bus port">
 <PROTOCOL spec="com/altera/AlteraAHB.xml">

```
<ACCEPT operation="read"/>
<ACCEPT operation="burst read"/>
<ACCEPT operation="locked read"/>
<GENERATE operation="split master response"/>
<PARAMETER name="addr_width" value="16/32"/>
</PROTOCOL>
</PORT>
```

Determining Allowability of Connections

Figure 5:
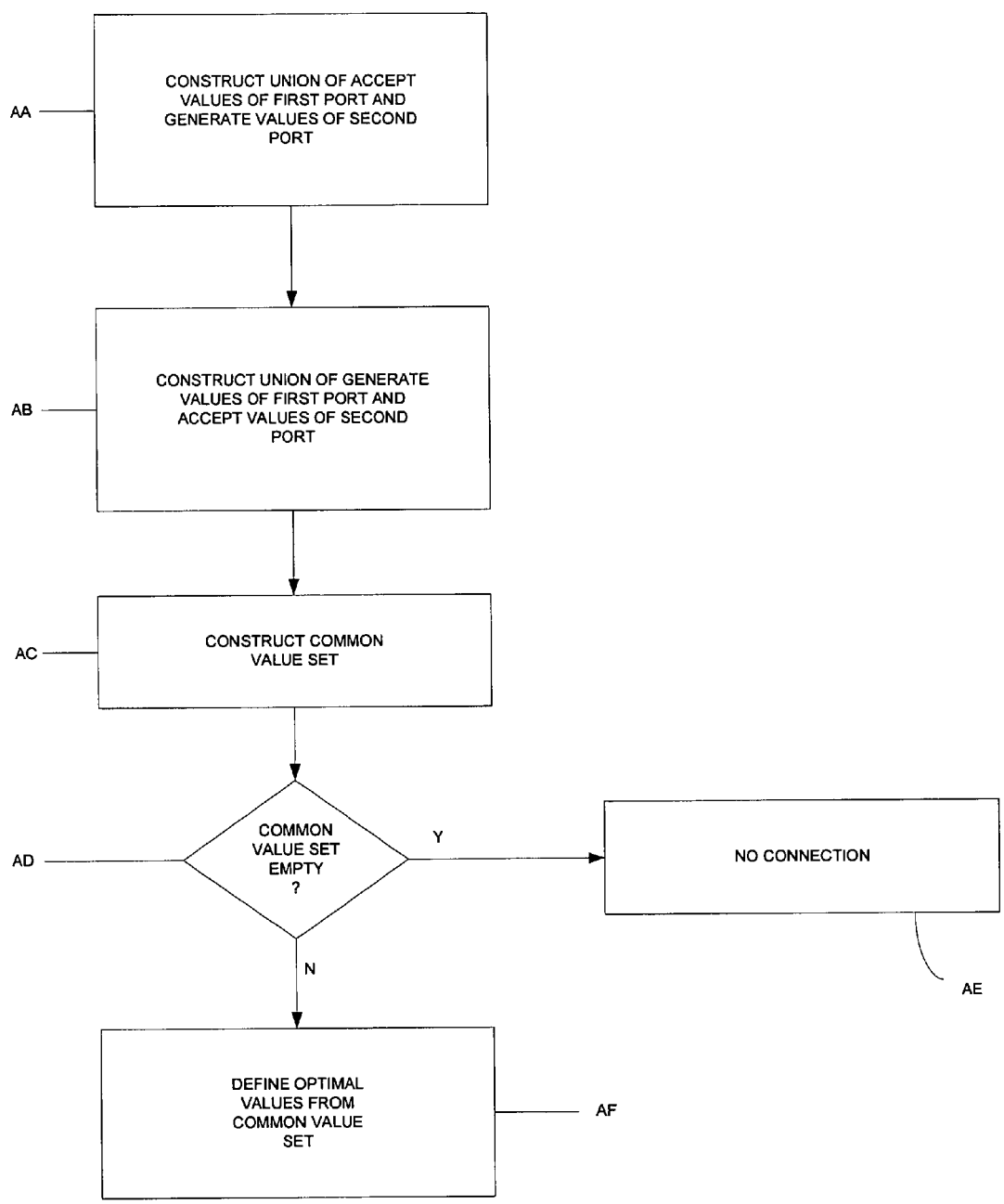
FIG. 5 illustrates part of a method embodying one aspect of the present invention.

In order for a designer to connect two ports together, the following process is used to determine the parameters used for such connection. The process is shown in FIG. 5.

At step AA, a union of the ACCEPT values from the first port and the GENERATE values of the second port is constructed. This union represents values that the first port can accept from the set that the second port can generate.

At step AB, a union of the GENERATE set from the first port and the ACCEPT set of the second port is constructed. Similar to above, the union represents values that the second port can accept from those values which the first port can generate.

A common value set comprising the contents of the two unions is constructed (step AC), and examined to determine if it is empty (step AD). If it is empty then the connection cannot be made (step AE). If the common value set is not empty, then a working choice of values is made.

The common value set for the ports is examined and optimal values are chosen (step AF).

Determining Required Physical Connections

Figure 6:
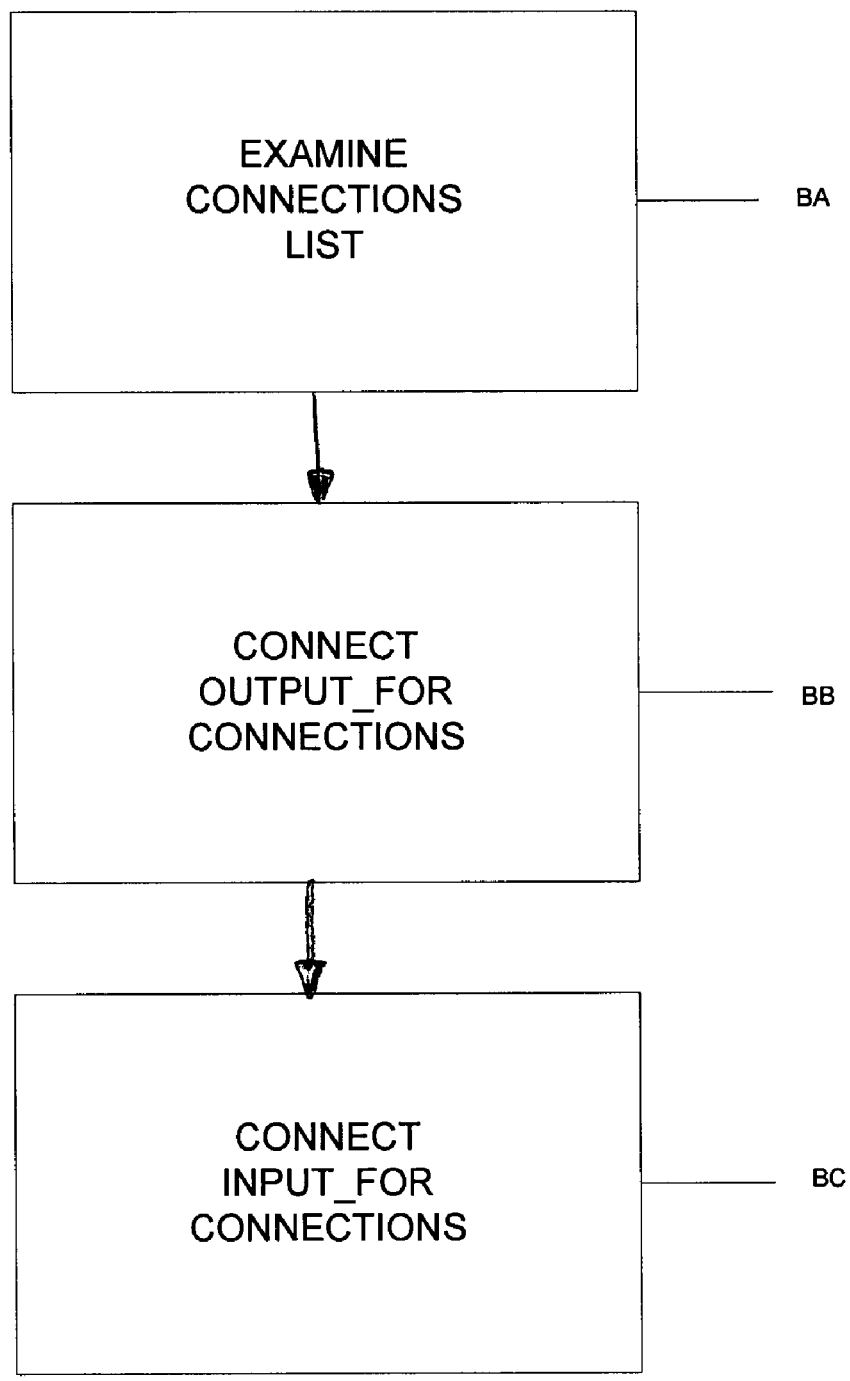
FIG. 6 illustrates part of a method embodying one aspect of the present invention.

As illustrated in FIG. 6, when the physical connection between the ports on the IP blocks is constructed the list of connections in the protocol definition is examined (steps BA) and any connections required as an "OUTPUT-FOR" or an "INPUT-FOR" the operations carried out between the ports are connected (steps BB and BC).

This ensures no unnecessary connections are made between the blocks.

This mechanism of describing component ports and their connectivity allows components to optimise their implementation based on use (by inspecting the final "resolved" sets of operation used); this mechanism also allows tools to be constructed to connect IP blocks which are independent of any bus protocol.

The particular method mentioned above includes specific examples of naming and connection protocols. It will be readily appreciated that the techniques embodying the present invention can be implemented in other specific ways.

Methods embodying the present invention are particularly useful when implemented using Altera™ Quartus™ or SOPC Builder™ products.

The invention claimed is:

1. A system design method comprising:
  receiving a system design including components connected via component ports from a system designer;
  for each of the component ports, identifying a plurality of bus/communication protocols supported by the component port;
  comparing the plurality of bus/communication protocols supported by the component ports to identify a subset of the plurality of bus/communication protocols supported by all of the component ports;
  determining the number of bus/communication protocols included in the subset;
  in response to the number of bus/communication protocols being at least two, presenting the subset of the plurality of bus/communication protocols to the system designer; and
  receiving a selection from the system designer of one of the subset of the plurality of bus/communication protocols to implement connections between the components via the component ports.

2. The system design method of claim 1, wherein comparing the plurality of bus/communication protocols comprises:
  comparing a parameter value of a first one of the plurality of bus/communication protocols supported by a first one of the component ports with corresponding parameter values of each of the plurality of bus/communication protocols supported by the other component ports to identify the subset of the plurality of bus/communication protocols having compatible parameter values.

3. The system design method of claim 1, wherein comparing the plurality of bus/communication protocols comprises:
  comparing an operation of a first one of the plurality of bus/communication protocols supported by a first one of the component ports with corresponding operations of each of the plurality of bus/communication protocols supported by the other component ports to identify the subset of the plurality of bus/communication protocols having compatible operations.

4. The system design method of claim 3, wherein the subset of the plurality of bus/communication protocols having compatible operations includes a first operation associated with a first one of the component ports and a complementary operation associated with at least one of the other component ports.

5. The system design method of claim 3, wherein the subset of the plurality of bus/communication protocols having compatible connection values includes an input for a first operation associated with a first one of the component ports and an output for the first operation associated with at least one of the other component ports.

6. The system design method of claim 1, wherein comparing the plurality of bus/communication protocols comprises:
  comparing a connection value of a first one of the plurality of bus/communication protocols supported by a first one of the component ports with corresponding connection values of each of the plurality of bus/communication protocols supported by the other component ports to identify the subset of the plurality of bus/communication protocols having compatible connection values.

7. The system design method of claim 1, wherein comparing the plurality of bus/communication protocols comprises:
  comparing a role value of a first one of the plurality of bus/communication protocols supported by a first one of the component ports with corresponding role values of each of the plurality of bus/communication protocols supported by the other component ports to identify the subset of the plurality of bus/communication protocols having compatible role values, wherein each role value is associated with at least one connection value, wherein each connection value is associated with at least one operation, wherein each operation is associated with at least one parameter value.

8. The system design method of claim 1, wherein selecting one of the subset of the plurality of bus/communication protocols to implement connections between the components via the component ports further comprises:

determining the number of bus/communication protocols included in the subset;

in response to the number of bus/communication protocols included in the subset being one, selecting the single bus/communication protocol; and in response to the subset being an empty set, notifying the system designer that the connections between the components via the component ports cannot be made.

9. The system design method of claim 8, further comprising:

in response to the number of bus/communication protocols included in the subset of the plurality of bus/communication protocols being at least two, automatically selecting one of the subset of the plurality of bus/communication protocols to implement connections between the components via the component ports.

10. The system design method of claim 1, wherein identifying a plurality of bus/communication protocols supported by the component port comprises:

for each component port, retrieving corresponding component information from a component library storing previously defined component information, wherein the corresponding component information specifies at least a portion of at least one bus/communication protocol supported by the component port.

11. The system design method of claim 10, wherein the component library is stored in a database.

12. The system design method of claim 10, wherein the component information specifies at least a portion of at least one bus/communication protocol in an XML format.

13. The system design method of claim 1, further comprising:

analyzing the selected one of the subset of the plurality of bus/communication protocols to identify a first set of connections defined by the selected one of the subset of bus/communication protocols;

analyzing the component ports of the components to identify the connections used by the component ports of the components for the selected one of the subset of bus/communication protocols; and comparing the connections used by the component ports of the components with the first set of connections to determine a portion of the first set of connections necessary to implement the connections.

\* \* \* \* \*